(12) United States Patent
Takeda et al.

(10) Patent No.: US 7,984,977 B2
(45) Date of Patent: Jul. 26, 2011

(54) PIEZOELECTRIC ELEMENT, MANUFACTURING METHOD FOR PIEZOELECTRIC BODY, AND LIQUID JET HEAD

(75) Inventors: Kenichi Takeda, Yokohama (JP);
Katsumi Aoki, Yokohama (JP);
Toshihiro Ifuku, Yokohama (JP);
Takanori Matsuda, Tokyo (JP); Tetsuro Fukui, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 964 days.

(21) Appl. No.: 11/769,091

(22) Filed: Jun. 27, 2007

(65) Prior Publication Data

US 2008/0012908 A1    Jan. 17, 2008

(30) Foreign Application Priority Data

Jul. 14, 2006   (JP) ................................. 2006-194702

(51) Int. Cl.
*B41J 2/045* (2006.01)

(52) U.S. Cl. ............................................ 347/68; 117/7

(58) Field of Classification Search ................... 347/68; 117/7
See application file for complete search history.

(56) References Cited

U.S. PATENT DOCUMENTS

| 5,431,958 | A | 7/1995 | Desu et al. |
| 6,162,744 | A * | 12/2000 | Al-Shareef et al. ........... 438/785 |
| 6,198,208 | B1 | 3/2001 | Yano et al. |
| 6,548,854 | B1 * | 4/2003 | Kizilyalli et al. ............ 257/310 |
| 6,624,462 | B1 * | 9/2003 | Kohara et al. ................ 257/310 |
| 6,854,832 | B2 | 2/2005 | Matsuda ......................... 347/68 |
| 6,927,084 | B2 | 8/2005 | Fukui et al. ..................... 438/21 |
| 7,045,935 | B2 | 5/2006 | Matsuda et al. ............. 310/363 |
| 7,053,526 | B2 | 5/2006 | Unno et al. .................. 310/324 |
| 7,069,631 | B2 | 7/2006 | Unno et al. .................. 29/25.35 |
| 7,120,978 | B2 | 10/2006 | Wasa et al. .................. 29/25.35 |
| 7,144,101 | B2 | 12/2006 | Ifuku et al. ...................... 347/72 |
| 7,235,917 | B2 | 6/2007 | Fukui et al. .................. 310/364 |
| 7,279,825 | B2 | 10/2007 | Ifuku et al. .................. 310/358 |
| 2006/0049135 | A1 | 3/2006 | Okabe et al. ................... 216/27 |
| 2006/0256167 | A1 | 11/2006 | Ifuku et al. ...................... 347/72 |
| 2007/0002103 | A1 | 1/2007 | Wasa et al. ....................... 347/72 |
| 2007/0090728 | A1 | 4/2007 | Matsuda et al. ............. 310/358 |
| 2007/0215715 | A1 | 9/2007 | Fukui et al. ................. 239/102.2 |

FOREIGN PATENT DOCUMENTS

| JP | 6-280023 | | 10/1994 |
| JP | 09-67193 | * | 3/1997 |
| JP | 2000-332569 | | 11/2000 |

* cited by examiner

*Primary Examiner* — Charlie Peng
(74) *Attorney, Agent, or Firm* — Fitzpatrick, Cella, Harper & Scinto

(57) ABSTRACT

A piezoelectric element comprises a piezoelectric body including a film made of an $ABO_3$ perovskite oxide crystal epitaxially grown above a substrate, and a pair of electrode layers provided to the piezoelectric body, wherein the piezoelectric body has a porous region on a side opposite to a side of the substrate.

4 Claims, 11 Drawing Sheets

PIEZOELECTRIC ELEMENT, MANUFACTURING METHOD FOR PIEZOELECTRIC BODY, AND LIQUID JET HEAD

BACKGROUND OF THE INVENTION

1. Field of the Invention

The present invention relates to a piezoelectric/electrostrictive (hereinafter, also referred to as "piezoelectric body") element having a porous region, a manufacturing method for a piezoelectric/electrostrictive body, and a liquid jet head using the same. In particular, the present invention relates to a piezoelectric/electrostrictive element which is excellent in durability and can be miniaturized while achieving a higher performance, a manufacturing method therefor, and a liquid jet head which is excellent in durability and can be increased in size while achieving a higher performance.

2. Description of the Related Art

A piezoelectric/electrostrictive element is constituted by using a thin film having characteristics such as piezoelectricity, pyroelectricity, or ferroelectricity, and is used as a piezoelectric element, an ultrasonic application element, an electro-optic element, a pyroelectric element, a ferroelectric element, or the like. Specific examples of the piezoelectric/electrostrictive element include a semiconductor memory device such as a nonvolatile memory, a surface acoustic wave element, a bulk acoustic wave element, an acceleration sensor, a piezoelectric actuator, and a pyroelectric infrared ray sensing element. In addition, on a mobile communication market, the piezoelectric/electrostrictive element can also be used as a surface acoustic wave (SAW) device used for filters for RF and IF, a film bulk acoustic resonator (FBAR), or the like. The piezoelectric element of a thin-film oscillator, the piezoelectric actuator, or the like which is used as a key component of telecommunication devices, a television, and the like includes a piezoelectric body and electrodes provided on upper and lower portions of the piezoelectric body, and converts electric charges applied between the electrodes into mechanical energy.

The piezoelectric/electrostrictive element has been produced such that a thin film, which is obtained by mechanically processing a material made of a single crystal having piezoelectricity, pyroelectricity, or ferroelectricity, or a material made of a polycrystalline sintered body, is bonded to a substrate. In recent years, while there are demands for miniaturization of a device, increase in concentration, reduction in weight, and higher performance, the manufacturing method in which the single crystal material having high performance is mechanically processed has a limitation in obtaining higher density. Accordingly, various methods of manufacturing the piezoelectric/electrostrictive element by forming a film using those single crystal materials on a single crystal substrate to be used as a device have been developed.

In recent years, a liquid jet head utilizing the piezoelectric element has been used in many cases because the liquid jet head can be used for an ink jet printer utilized as an output apparatus for a personal computer and the like, with high printing performance, with simple handling, and at low costs. The liquid jet head using the piezoelectric element is, for example, provided with multiple individual liquid chambers to communicate with a common liquid chamber containing ink, transfers displacement of the piezoelectric elements provided so as to correspond to the individual liquid chambers through a diaphragm, and ejects ink inside thereof from a liquid injection or ejection port as liquid droplets.

In recent years, in the liquid jet head, in addition to the demand for improvement of the printing performance, in particular, the higher resolution and high-speed printing, there is a demand for increase in length and reduction in costs. Accordingly, with a structure of a multi-nozzle head having individual liquid chambers miniaturized, achievement of the higher resolution and high-speed printing has been attempted. In order to miniaturize the individual liquid chambers of the liquid jet head, it is necessary to achieve miniaturization, higher density, and higher performance of the piezoelectric element. In order to achieve increase in length and reduction in costs of the liquid jet head, it is necessary to enlarge an area of a substrate used for manufacturing the liquid jet head.

As the manufacturing method for the piezoelectric element of the liquid jet head or the above-mentioned piezoelectric/electrostrictive element, there is proposed a method of enabling miniaturization thereof by, for example, forming an epitaxial thin film made of a piezoelectric/electrostrictive material to be patterned. As a method of forming the epitaxial thin film, a chemical solution deposition (CSD) method (a Sol-Gel method), a sputtering method, an MBE method, a PLD method, a CVD method, and the like are employed. In the sputtering method and the PLD method, atoms or the like emitted by application of an ion beam, a pulse laser beam, or the like to a target are deposited on a substrate such as a single crystal which is heated up, to thereby obtain a desired crystalline thin film by epitaxial growth. In the CVD method and the MBE method, a gaseous raw material is deposited on a substrate such as a single crystal which is heated up, to thereby obtain a desired thin film having desired crystallinity by epitaxial growth. In the Sol-Gel method, a low-temperature sputtering method, and the like, an amorphous film serving as a precursor of a desired crystal film is formed on a substrate, and is then crystallized by energy from an outside such as burning or application of light, to thereby obtain a thin film.

In order to produce the crystalline thin film as a single crystal having a single orientation with the orientation in the same direction, or with uniformity in an in-plane orientation, it is necessary that the substrate or a lower layer on which the thin film is deposited be made of a single crystal, and atoms constituting the thin film to be deposited have excellent crystal lattice matching.

For example, as a material of a lower layer of a PZT piezoelectric/electrostrictive body in a PZT piezoelectric/electrostrictive element, which has excellent crystal lattice matching with a crystal of atoms of the PZT piezoelectric/electrostrictive body, Japanese Patent Application Laid-Open No. 2000-332569 discloses a buffer layer including $ZrO_2$, a stabilized zirconia thin film, and a rare-earth oxide (YSZ), and Japanese Patent Application Laid-Open No. H06-280023 discloses a buffer layer using an SRO which can also be used as an electrode material.

On the other hand, in order to enlarge the area of the substrate used for forming the piezoelectric/electrostrictive element, for example, a method of using a silicon single crystal substrate with a large area such as a 6-inch wafer has been reviewed. In a case where, on the silicon single crystal substrate, a YSZ buffer layer, a Pt lower electrode, and a lead zirconate titanate (PZT) piezoelectric/electrostrictive body are subsequently stacked, a large stress is applied to an inside of a film or an interface between layers due to mismatching of crystal lattice constants between layers including the substrate. As a result, a dielectric constant, a Curie temperature, a coercive electric field, remanent polarization, and the like are changed, degradation of crystallinity may be caused, which may lead to warp of each layer or the substrate and peeling of each layer. Such strain is liable to be increased along with the improvement of the crystallinity of the oriented film made of PZT, and it is extremely difficult to achieve both enlargement of area and improvement of film performance due to the improvement of the crystallinity, which also affects mass production. Particularly, in the liquid jet head, in a case where a piezoelectric/electrostrictive body having high crystallinity is used, interfaces between layers of the piezoelectric/electrostrictive body, the electrode, the buffer layer, the substrate, and the like are liable to be peeled, which raises problems of stability of liquid jet and durability as a device.

SUMMARY OF THE INVENTION

In order to solve the problems, it is an object of the present invention to provide a piezoelectric/electrostrictive element which suppresses generation of a stress exerted between a substrate and each layer, suppresses degradation of a piezoelectric/electrostrictive property and pealing caused between each layer, has excellent durability, and can be formed on a substrate having a large area with high density while having high crystallinity, and a manufacturing method for a piezoelectric/electrostrictive body.

In order to solve the problems, it is an another object of the present invention to provide a liquid jet head having high reliability and a large area which suppresses degradation of a ferroelectric property and peeling of layers, has excellent durability, includes a piezoelectric/electrostrictive body formed with high density, and is capable of achieving higher resolution and high-speed printing.

In order to solve the above-mentioned problems, the inventors have acknowledged that, by forming a porous region in the piezoelectric/electrostrictive body of the piezoelectric/electrostrictive element, it is possible to absorb strain caused in interfaces between a substrate, an electrode, a piezoelectric/electrostrictive body, a buffer layer, and the like and suppress degradation of the piezoelectric/electrostrictive property. Particularly, it has been found that the piezoelectric/electrostrictive element using the piezoelectric/electrostrictive body having the porous region formed on an opposite side of the substrate within a piezoelectric/electrostrictive layer or on an opposite side of a lower electrode layer, has excellent durability with respect to the strain caused between layers when a piezoelectric/electrostrictive body having high crystallinity is used, and to the degradation of the piezoelectric/electrostrictive property. It has been acknowledged that the use of the piezoelectric/electrostrictive element enables obtainment of a liquid jet head which achieves higher resolution and high-speed printing, has excellent durability, and has a large area.

In order to manufacture the piezoelectric/electrostrictive body which is porous and has high crystallinity, the inventors have acknowledged that it is desirable to convert an $AO_x$ crystal phase into an $ABO_3$ perovskite oxide crystal phase after a thin film in which both the $AO_x$ crystal phase and the $ABO_3$ perovskite oxide crystal phase are present is formed by epitaxial deposition. In order to form the thin film in which both the $AO_x$ crystal phase and the $ABO_3$ perovskite oxide crystal phase are present, it is desirable to heat the substrate up to a temperature at which both the $AO_x$ crystal and the $ABO_3$ perovskite oxide crystal are present to thereby form a film by epitaxial deposition by using an $ABO_3$ perovskite oxide. After that, the substrate having the thin film formed thereon, in which both the $AO_x$ crystal phase and the $ABO_3$ perovskite oxide crystal phase are present, is heated up to a temperature for forming the $ABO_3$ perovskite oxide crystal, which exceeds a temperature at which the $AO_x$ crystal can be present. Then, the $AO_x$ crystal is converted into the $ABO_3$ perovskite oxide crystal. It has been found that the $ABO_3$ perovskite oxide crystal film formed by the method has high crystallinity and has a porous region on the opposite side of the substrate within the piezoelectric/electrostrictive layer or on the opposite side of the lower electrode layer. The inventors have acknowledged that, in a case where the obtained piezoelectric/electrostrictive body is used for the piezoelectric/electrostrictive element of the liquid jet head, it is possible to absorb the strain caused between layers, have durability, and achieve higher resolution and high-speed printing even when the piezoelectric/electrostrictive body has high crystallinity. Based on the acknowledgement, the present invention has been achieved.

In other words, the present invention relates to a piezoelectric element including: a piezoelectric body including a film made of an $ABO_3$ perovskite oxide crystal epitaxially grown above a substrate; and a pair of electrode layers provided to the piezoelectric body, in which the piezoelectric body has a porous region on a side opposite to a side of the substrate.

Further, the present invention relates to a liquid jet head including: the piezoelectric element; a discharge port for discharging a liquid; and a liquid chamber which communicates with the discharge port, to which the piezoelectric element is correspondingly provided.

Further, the present invention relates to a method of manufacturing a piezoelectric body by forming a film made of an $ABO_3$ perovskite oxide crystal epitaxially grown on a substrate the method including: forming a film containing an $AO_x$ crystal and the $ABO_3$ perovskite oxide crystal using an oxide containing an A element and a B element by heating the substrate to a temperature at which the $AO_x$ crystal and the $ABO_3$ perovskite oxide crystal are formed; and changing the film containing the $AO_x$ crystal and the $ABO_3$ perovskite oxide crystal into the film made of the $ABO_3$ perovskite oxide crystal by heating the substrate to a temperature or more which exceeds a temperature at which the $AO_x$ crystal can be present, and at which the $ABO_3$ perovskite oxide crystal is formed.

The piezoelectric/electrostrictive element according to the present invention suppresses generation of a stress exerted between a substrate and each layer, degradation of a piezoelectric/electrostrictive property, and pealing caused between each layer, has excellent durability, and can be formed on a substrate having a large area with high density while having high crystallinity.

The method of manufacturing the piezoelectric/electrostrictive body according to the present invention is capable of manufacturing a piezoelectric/electrostrictive body suitable for the piezoelectric/electrostrictive element which suppresses generation of a stress exerted between a substrate and each layer, degradation of a piezoelectric/electrostrictive property, and peeling caused between each layer, has excellent durability, and is miniaturized to be formed on a substrate having a large area with high density.

Further, the liquid jet head according to the present invention includes a piezoelectric/electrostrictive body which suppresses degradation of a ferroelectric property and peeling between a substrate and each layer, has excellent durability, and is formed with a long length and with high density, thereby being capable of achieving higher resolution and high-speed printing with high reliability.

Further features of the present invention will become apparent from the following description of exemplary embodiments with reference to the attached drawings.

DESCRIPTION OF THE EMBODIMENTS

Figure 1A:
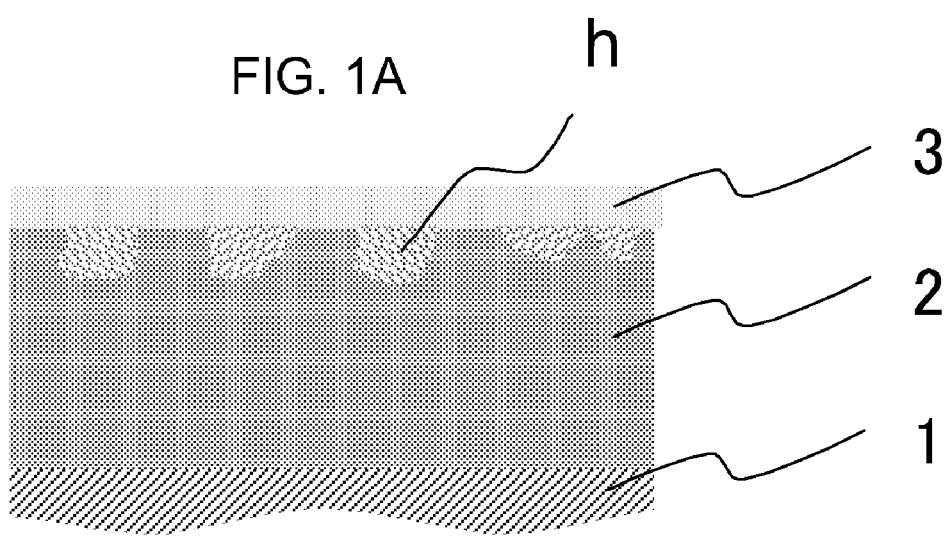
FIGS. 1A and 1B are schematic diagrams each illustrating a cross-section of an example of a piezoelectric/electrostrictive element according to the present invention.

A piezoelectric element according to the present invention includes a piezoelectric body having a film made of an $ABO_3$ perovskite oxide crystal epitaxially grown on a substrate, and a pair of electrode layers provided to the piezoelectric body. The piezoelectric element is characterized in that the piezoelectric body has a porous region on a side opposite to a side of the substrate.

As a substrate used for the piezoelectric/electrostrictive element according to the present invention, any type of substrate may be used as long as a piezoelectric/electrostrictive layer can be stacked thereon through a lower electrode layer or directly stacked thereon. In a case where an upper layer is provided by epitaxial deposition, the substrate desirably has high crystallinity and has a crystal lattice constant approximate to that of the upper layer. Specific examples of a material of the substrate include silicon, magnesia, strontium titanate, zirconia (yttrium-stabilized zirconia), sapphire ($\alpha$-$Al_2O_3$), gallium nitride, indium arsenide, indium phosphide, gallium arsenide, gallium phosphide, zinc oxide, lanthanum aluminate, and silicon carbide. As described later, those materials may have a function as a lower electrode by being doped with La, Zn, S, or the like (LaSTO). In addition, a silicon single crystal substrate such as SOI including an oxide film $SiO2$ having a thickness of several nm or smaller on a surface of the silicon single crystal may be used. The thickness of the substrate is, for example, 100 μm to 1000 μm.

The lower electrode layer used for the piezoelectric/electrostrictive element according to the present invention has a function of applying a voltage to the piezoelectric/electrostrictive layer provided on the upper layer. In a case where the substrate has electrical conductivity and a matching property between a crystal lattice orientation and a crystal lattice constant with the piezoelectric/electrostrictive body is excellent, the lower electrode layer can be omitted. Specifically, the case where the lower electrode layer can be omitted includes a case where a single crystal substrate of $LaSrTiO_3$ (La:3.73 wt. %) (100) having electrical conductivity by doping an $SrTiO_3$ substrate with La, and a PZT piezoelectric body are used.

Specifically, as a material of the lower electrode layer, a conductive material such as a platinum group metal including Ru, Rh, Pd, Os, Ir, and Pt, and a platinum metal oxide including $SrRuO_3$, $LaScCoO_3$, $BaPbO_3$, and $RuO_3$ may be desirably used.

The lower electrode layer desirably has a preferred crystal orientation of (100), (110), or (111) on a surface in contact with the substrate because the crystal orientation of the lower electrode layer affects the crystal orientation of the piezoelectric/electrostrictive layer in a case where the piezoelectric/electrostrictive layer is formed on the lower electrode layer by epitaxial deposition. If the preferred crystal orientation of the lower electrode layer on the surface in contact with the substrate is (100), (110), or (111), the piezoelectric/electrostrictive layer epitaxially deposited is oriented with the preferred crystal orientation of (100)/(001).

The platinum group metal constituting the lower electrode layer, or an oxide thereof desirably has a crystal orientation rate of 80% or more, and more desirably 90% or more. If the platinum group metal constituting the lower electrode layer, or the oxide thereof has the crystal orientation rate of 80% or more, the lower electrode layer has an excellent electrical characteristic, and the piezoelectric/electrostrictive layer formed thereon has excellent crystallinity.

In this case, the crystal orientation rate is assumed as a rate which is defined as a peak strength ratio by θ-2θ measurement with an X-ray diffraction instrument.

In addition, a film thickness of the lower electrode layer is desirably 100 nm to 1000 nm. If the film thickness thereof is 100 nm or more, it is possible to obtain sufficient electrical conductivity even in an oxide electrode such as $SrRuO_3$ having electrical conductivity lower than that of the platinum group metal. If the film thickness thereof is 1000 nm or smaller, it is possible to suppress increase of the stress exerted on the substrate and the interface between electrodes, and suppress generation of peeling.

Figure 1B:
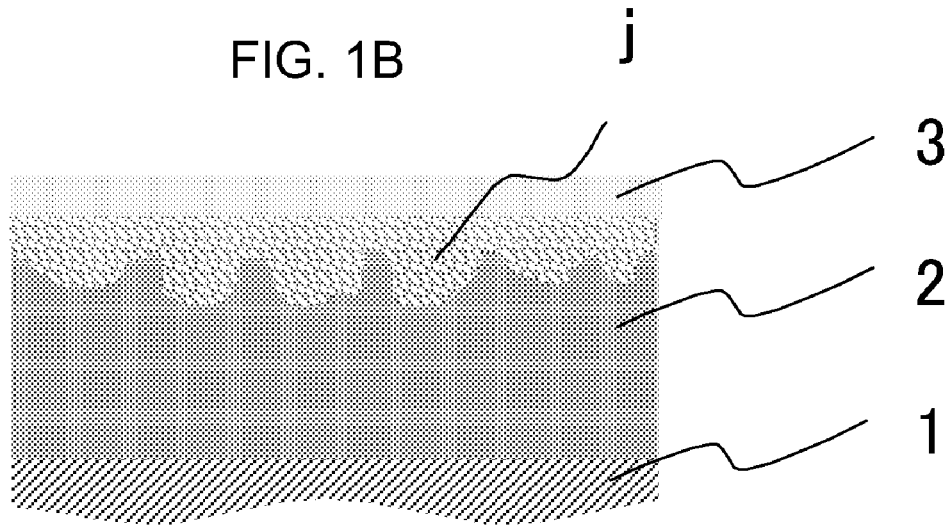
Figure 2:
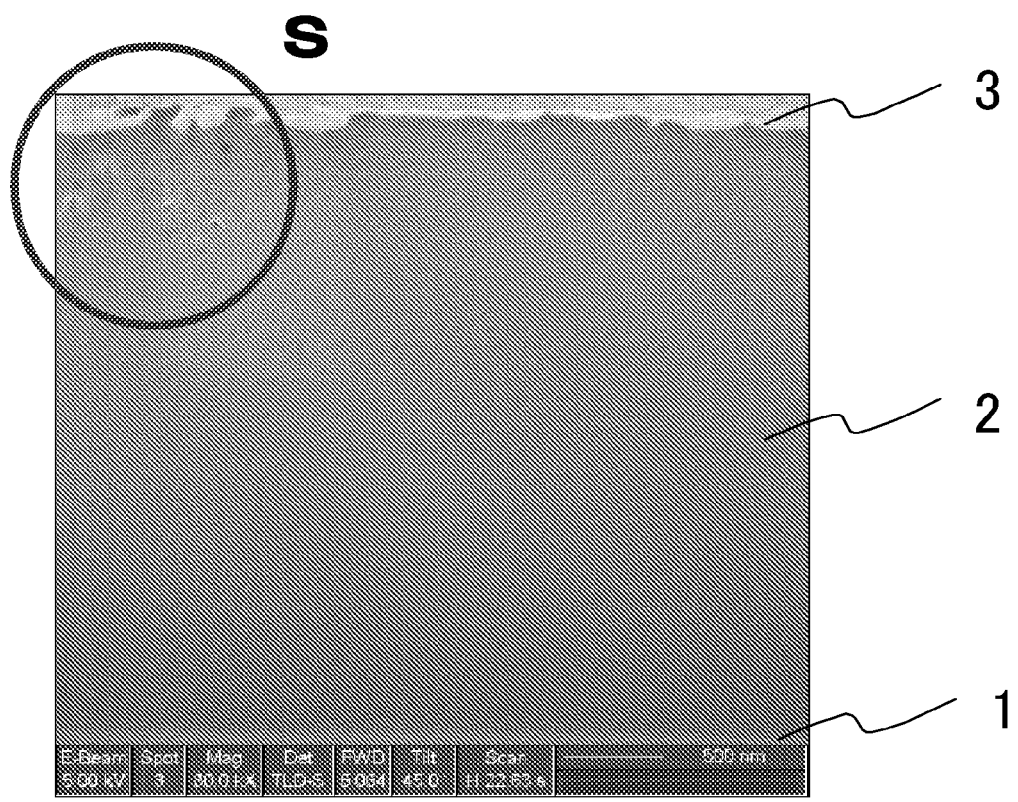
FIG. 2 is a diagram illustrating a cross-section SEM image of an example of the piezoelectric/electrostrictive element according to the present invention.

The piezoelectric/electrostrictive layer of the piezoelectric/electrostrictive element according to the present invention has a porous region. As illustrated in the schematic diagrams of FIGS. 1A and 1B, the porous region is provided on an opposite side of the substrate of the piezoelectric/electrostrictive layer or the lower electrode layer. An example of a multi-cellular structure of the porous region includes a recessed portion h formed in a piezoelectric/electrostrictive layer 2 of an interface portion being in contact with an upper layer 3 serving as an upper electrode, a multi-cellular structure j having multiple steps in which a recessed portion is further formed in the recessed portion, and a closed cellular structure formed under the interface. The porous region is desirably provided within a thickness of ½ or smaller of the piezoelectric/electrostrictive layer, and more desirably within a thickness of ⅓ or smaller. Specifically, in a diagram of FIG. 2 illustrating a cross-section scanning electron microscope (SEM) image of the piezoelectric/electrostrictive element according to the present invention, the porous region is present on the interface between the piezoelectric/electrostrictive layer 2 and the upper electrode layer 3 and in a vicinity S thereof (encircled portion) The cross-section SEM photograph of the piezoelectric/electrostrictive element illustrated in FIG. 2 is obtained by vertically cutting the piezoelectric/electrostrictive element from the upper electrode layer side by a focused ion beam (FIB) and taking an image thereof with an angle of 45° with respect to the cross-section cut by the SEM.

Figure 3:
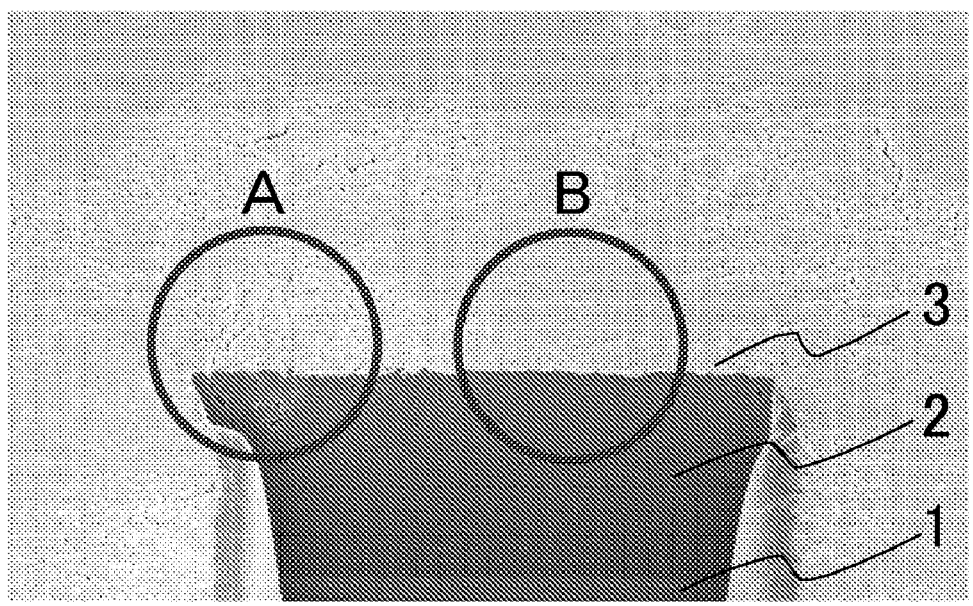
FIG. 3 is a diagram illustrating a cross-section SEM image of an example of the piezoelectric/electrostrictive element according to the present invention.

In the piezoelectric/electrostrictive layer having the porous region, a relationship between the porous region and a form of the interface in contact with the upper layer is as follows. As illustrated in FIG. 3, an interface corresponding to a portion having the porous region becomes a flexible portion A, and an interface corresponding to a portion having a smaller or no porous region becomes a flat portion B. For this reason, the form of the interface can be recognized as an index for judgement as to whether the porous region is present or not. In the piezoelectric/electrostrictive layer, the porous region is desirably provided uniformly in a surface direction.

The piezoelectric/electrostrictive layer having the porous region is desirably made of a single-oriented crystal film or a single crystal film.

In this case, the single-oriented crystal film indicates a uniaxial-oriented crystal film having a single crystal orientation in the film thickness direction. The film may have any orientation in the film surface direction. Specifically, when the piezoelectric/electrostrictive layer has a <100> orientation, the film is made of a crystal having a crystal axis in the thickness direction with only <100> orientation.

Further, in the above-mentioned piezoelectric/electrostrictive layer, the single-oriented crystal film is desirably a crystal film whose crystal surfaces to be objected are uniform in parallel with the film surface direction. For example, a (001) single-oriented film indicates a film having a (001) surface in substantially parallel with the film surface. Specifically, when measurement by the X-ray diffraction is performed, a peak strength of reflection on surfaces other than the surface to be objected is desirably 10% or smaller, and more desirably 5% or smaller of a maximum peak strength on the surface to be objected.

Generally, [100] and [001] surfaces are the same in a case where a crystal system is a cubical crystal, but are different from each other in a case where the crystal system is a monoclinic crystal, a tetragonal crystal, or a rhombohedral crystal. However, when the monoclinic crystal, the tetragonal crystal, and the rhombohedral crystal each have a lattice constant approximate to that of the cubical crystal, for example, in an $ABO_3$ perovskite oxide, [100] and [001] surfaces of the tetragonal crystal and [111] and [-1-1-1] surfaces of the rhombohedral crystal can also be <100> or <111> oriented.

In addition, the <100> orientation means that the crystal film has a single crystal axis with the <100> orientation in the same direction as the thickness direction. Also in a case where a <100> crystal axis is tilted by about 5 degrees, for example, in the thickness direction, the crystal film is assumed to have the <100> orientation.

Figure 4:
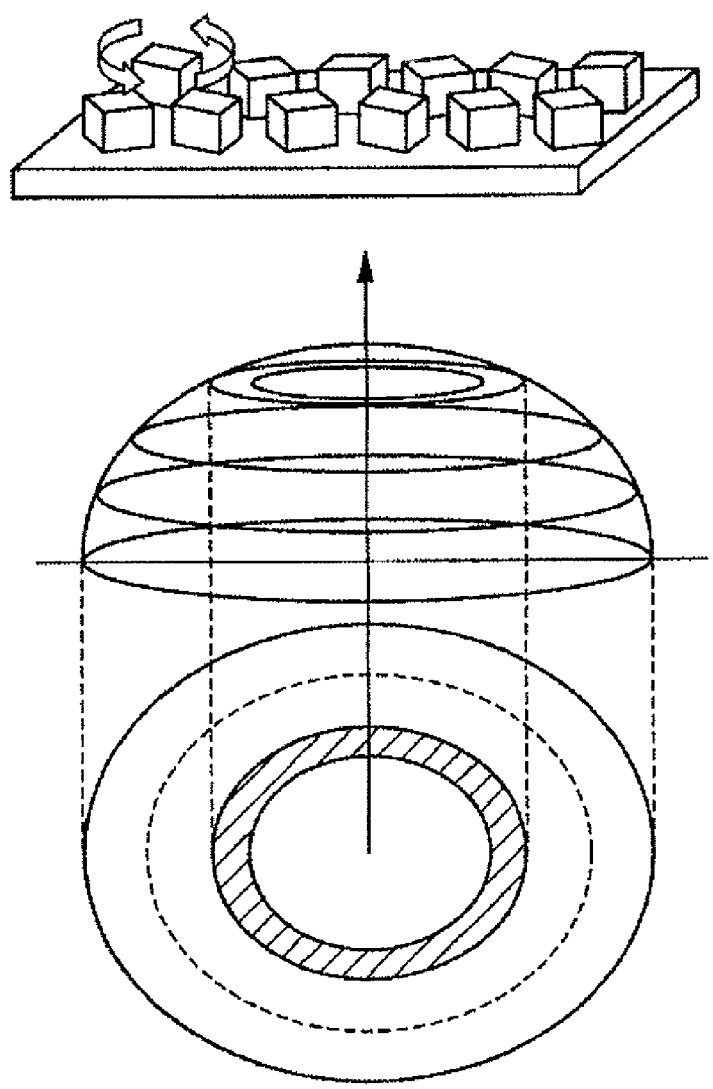
FIG. 4 is a schematic diagram illustrating a pole measurement pattern by X-ray diffraction of a {110} asymmetric surface of a uniaxial-oriented crystal of a piezoelectric/electrostrictive body of an example of the piezoelectric/electrostrictive element according to the present invention.

The crystal orientation of the above-mentioned piezoelectric/electrostrictive layer can be confirmed using the X-ray diffraction instrument. For example, in a case where the piezoelectric/electrostrictive layer is formed of a PZT perovskite oxide crystal film, according to the θ-2θ measurement by X-ray diffraction, as a peak due to the crystal having the <100> orientation, only a peak of a (L00) surface (L=1, 2, 3 ..., n: n is an integer) such as {100} and {200} surfaces is detected. In addition, in a case where a pole of a {110} asymmetric surface is measured, a ring pattern is obtained at a position within the same diameter which represents a tilt of about 45 degrees from the center as illustrated in FIG. 4. In this case, {100} collectively indicates six surfaces generally represented as (100), (010), or (001), and <100> collectively indicates six orientations generally represented as [100], [010], or [001].

In addition, the single crystal film indicates a single-oriented film. Assuming that a surface of the film is represented as an X-Y surface and a thickness direction of the film is represented as a Z-axis, the single crystal film has crystals uniformly oriented in X-axis, Y-axis, and Z-axis directions, and has the single crystal orientation in the film thickness direction and the film surface direction. Specifically, the piezoelectric/electrostrictive layer having the <100> single crystal indicates that the film has only the <100> crystal axis in the same direction as the film thickness direction and only the <110> crystal axis in the film surface direction.

In addition, in the piezoelectric/electrostrictive layer, the single crystal film specifically indicates that, when the measurement by X-ray diffraction is performed, the peak strength of the reflection on the surfaces other than the surface to be objected is desirably 10% or smaller, and more desirably 5% or smaller, of the maximum peak strength on the surface to be objected. Further, the single crystal having high orientation indicates a crystal having a specific orientation of 50% or more, desirably 80% or more, and more desirably 99% or more, in a specific crystal structure by the X-ray diffraction.

Figure 5:
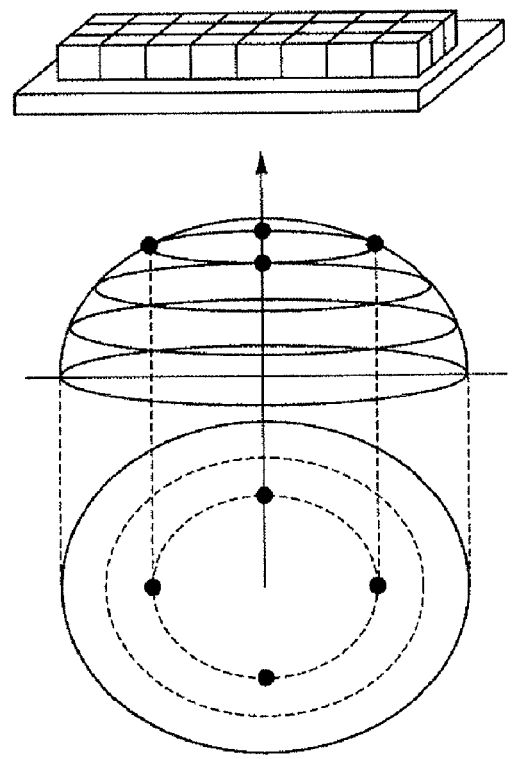
FIG. 5 is a schematic diagram illustrating a pole measurement pattern by X-ray diffraction of a {110} asymmetric surface of a single crystal of a piezoelectric/electrostrictive body of an example of the piezoelectric/electrostrictive element according to the present invention.

In the case where the piezoelectric/electrostrictive layer is formed of the PZT perovskite oxide crystal film, according to the 2θ-θ measurement by X-ray diffraction, as a peak due to the single crystal having the <100> orientation, only a peak of a (L00) surface (L=1, 2, 3 ..., n: n is an integer) such as {100} and {200} surfaces is detected. In addition, in a case where a pole of an {110} asymmetric surface is measured, a 4-fold symmetrical spot pattern is obtained by every 90 degrees at a position within the same diameter which represents a tilt of about 45 degrees from the center as illustrated in FIG. 5.

Further, in the crystal film with the <100> orientation of the above-mentioned piezoelectric/electrostrictive layer, when the pole of the {110} asymmetric surface is measured, in a case where an 8-fold or 12-fold symmetrical pattern is obtained at a position of the same diameter which represents a tilt of about 45 degrees from the center, the film can be assumed as the single crystal film and the single-oriented crystal film in the general meaning. Also, a crystal which does not have a spot pattern but has an oval pattern can be assumed as a crystal having an intermediate symmetry between the single crystal and the single-oriented crystal, and can be assumed as the single crystal film and the single-oriented crystal film in the general meaning. Similarly, when a monoclinic crystal and a tetragonal crystal, a monoclinic crystal and a rhombohedral crystal, a tetragonal crystal and a rhombohedral crystal, or multiple crystalline phases are mixed (mixed crystal), when a crystal due to a twin or the like is mixed, or when dislocation, a defect, or the like occurs, in a case where the lattice constants are approximate to each other, the film can be assumed as the single crystal film and the single-oriented crystal film. Further, even when crystal dislocation occurs in a columnar manner in the thickness direction, or when twin splitting is confirmed, the film can be assumed as the single crystal film in the general meaning.

As described above, the crystal orientation of the piezoelectric/electrostrictive layer can be easily confirmed by the X-ray diffraction. By methods other than the X-ray diffraction, for example, observation of the cross-section thereof by the TEM, the crystal orientation thereof can also be confirmed.

The piezoelectric/electrostrictive layer is desirably formed of an $ABO_3$ perovskite oxide crystal film since the film is assumed as the single crystal and the single-oriented crystal in the general meaning. The $ABO_3$ perovskite oxide crystal film is desirably formed of a Pb-based perovskite oxide crystal film. Specifically, A represents Pb, and B desirably includes Zr and Ti. As an $ABO_3$ perovskite oxide, an oxide represented by the following formula (1)

$$(Pb_{1-x}M_x)_{xm}(Zr_yTi_{1-y})O_z \tag{1}$$

is a desirable example. In the formula (1), M represents an atom selected from the group consisting of La, Ca, Ba, Sr, Bi, Sb, W, and Nb. In the formula (1), x, xm, y, and z each desirably represent such a numerical value that a composition of the $ABO_3$ perovskite oxide crystal film satisfies $0 \leq x < 0.2$, $1.0 \leq xm \leq 1.3$, $0.40 \leq y < 0.65$, and $2.5 \leq z \leq 3.0$.

In particular, as the $ABO_3$ perovskite oxide crystal film, a film made of a lead zirconate titanate crystal is desirably used.

Figure 6:
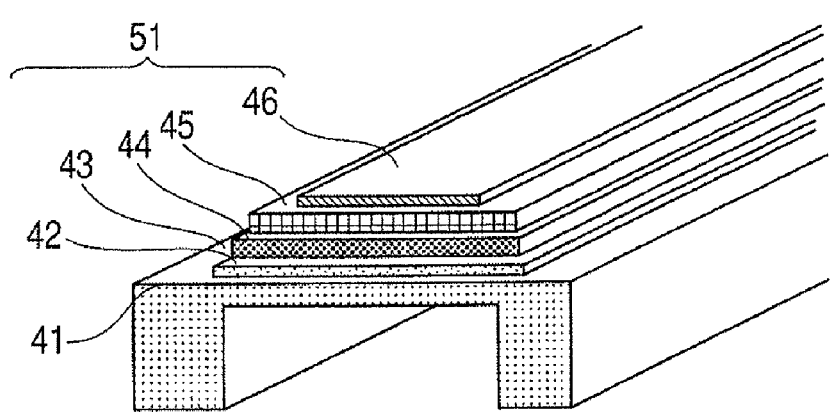
FIG. 6 is a schematic diagram illustrating a structure of an example of the piezoelectric/electrostrictive element according to the present invention.

The piezoelectric/electrostrictive element according to the present invention may include the piezoelectric/electrostrictive layer provided on the substrate or a lower electrode layer, and the piezoelectric element illustrated in FIG. 6 can be exemplified. In a piezoelectric element 51 illustrated in FIG. 6, on a substrate 41, a diaphragm 42 is formed, and a lower electrode layer 44, a piezoelectric layer 45, and an upper electrode layer 46 are formed thereon through a buffer layer 43 or a adhesion layer. In the piezoelectric element 51 illustrated in FIG. 6, the lower electrode layer 44 is formed between the buffer layer 43 or the adhesion layer and the piezoelectric layer 45, but the lower electrode layer may be formed between the diaphragm and the buffer layer.

The diaphragm is provided so as to transfer displacement of the piezoelectric body, and desirably has sufficiently high Young's modulus so that an excellent lattice matching property with respect to the substrate can be obtained and the displacement of the piezoelectric body can be amplified to be transferred. An example of a material of the diaphragm includes a material equivalent to the above-mentioned substrate. The substrate may have a function as the diaphragm by, for example, reducing the thickness thereof to 2 μm to 10 μm. Alternatively, the substrate may also function as a buffer layer, and the buffer layer can be omitted. The thickness of the diaphragm is, for example, 2 μm to 10 μm.

The buffer layer is provided so as to adjust the matching property of the crystal lattice orientation and the crystal lattice constant between the substrate and the piezoelectric body. The function of the buffer layer may be achieved by a stacked structure with several or multiple layers. In addition, the buffer layer is desirably made of a material capable of applying a load to the diaphragm with displacement of the piezoelectric body being as a compression stress. As the material of the buffer layer, a material having an excellent crystal lattice matching property also with respect to a layer immediately under the buffer layer is desirably used. In a case where the material of the substrate is Si, for example, stabilized zirconia YSZ ($Y_2O_3$—$ZrO_2$), $CeO_2$, and $SrTiO_3$ may be used. Further, when the lattice matching property between the substrate and the piezoelectric body is high, for example, when the material of the substrate is made of $SrTiO_3$, and when the piezoelectric layer is formed of an $ABO_3$ perovskite oxide crystal film, the buffer layer can be omitted.

In the case where the buffer layer is not provided, the adhesion layer plays a role of improving the adhesion of the lower electrode layer onto the diaphragm and having the matching property by adjusting the crystal lattice constant and the crystal orientation of the substrate and the piezoelectric/electrostrictive layer. An example of a material of the adhesion layer includes a metal such as Ti, Cr, and Ir, and an oxide including those metals such as $TiO_2$ and $IrO_2$. For example, Pt or the like naturally (111) oriented on a quartz glass may also be used. The film thickness of the adhesion layer is desirably 5 nm to 300 nm and more desirably 10 nm to 70 nm.

It is desirable that the upper electrode layer 46 be formed on the piezoelectric/electrostrictive layer. The upper electrode layer together with the lower electrode layer apply a voltage to the piezoelectric/electrostrictive layer sandwiched therebetween, and convert the electrical energy applied to the piezoelectric/electrostrictive layer into mechanical energy. As a result, it is possible to easily generate the displacement. An upper electrode layer having a material, crystal orientation, a crystal lattice constant, and a thickness that are the same as those of the lower electrode layer is a desirable example.

As the piezoelectric/electrostrictive element, for example, the following structures of materials shown in items (1) to (4) are exemplified. In the following, each material of the upper electrode layer/the piezoelectric/electrostrictive layer/the lower electrode layer/the buffer layer/the diaphragm/the substrate are shown. In addition, "/" indicates a stacked state.

(1) Pt/Ti (upper electrode layer)/$PbZrTiO_3$ (piezoelectric/electrostrictive layer)/Pt (lower electrode layer) /$LaNiO_3$/$CeO_2$/YSZ ($Y_2O_3$—$ZrO_2$) (buffer layer)/Si/SiOx (diaphragm)/Si (substrate);

(2) $SrRuO_3$ (upper electrode layer)/$PbZrTiO_3$ (piezoelectric/electrostrictive layer)/$SrRuO_3$ (lower electrode layer) /$LaNiO_3$/$CeO_2$/YSZ ($Y_2O_3$—$ZrO_2$) (buffer layer)/Si/$SiO_2$ (diaphragm)/Si (substrate);

(3) Pt/Ti (upper electrode layer)/$PbZrTiO_3$ (piezoelectric/electrostrictive layer)/$SrRuO_3$ (lower electrode layer)/$LaNiO_3$/$CeO_2$/YSZ ($Y_2O_3$—$ZrO_2$) (buffer layer)/Si/$SiO_2$ (diaphragm)/Si (substrate); and (4) Pt/Ti (upper electrode layer)/$PbZrTiO_3$ (piezoelectric/electrostrictive layer)/Pt/$SrRuO_3$ (lower electrode layer)/$LaNiO_3$/$CeO_2$/YSZ ($Y_2O_3$—$ZrO_2$) (buffer layer)/Si/$SiO_2$ (diaphragm)/Si (substrate).

The above-mentioned piezoelectric/electrostrictive elements can be produced by the following methods using a thin-film deposition technology. As a method of producing the lower electrode layer on the substrate, a sputtering method, a CVD method, a laser ablation method, an MBE method, and the like may be employed. Particularly, in the sputtering method, a deposited substrate is heated sufficiently during heating, thereby obtaining an oxide thin film epitaxially grown with respect to the substrate. It is desirable that the lower layer be made of any one of the above-mentioned materials and be epitaxially grown to obtain the preferred crystal orientation of any one of (100), (110), and (111) on a surface in contact with the substrate.

The manufacturing method for the piezoelectric/electrostrictive body is characterized by including the following processes.

The substrate is heated up to a temperature at which an $AO_x$ crystal and an $ABO_3$ perovskite oxide crystal are formed to thereby form a film including the $AO_x$ crystal and the ABO₃ perovskite oxide crystal using an oxide containing an A element and a B element.

The substrate is heated up to a temperature equal to or higher than a temperature which exceeds a temperature at which the $AO_x$ crystal can be present, and at which the $ABO_3$ perovskite oxide crystal is formed. As a result, the film including the $AO_x$ crystal and the $ABO_3$ perovskite oxide crystal is changed into the $ABO_3$ perovskite oxide crystal film.

As the epitaxial deposition method of producing the $ABO_3$ perovskite oxide crystal film, a CSD (Sol-Gel) method, a sputtering method, an MBE method, a PLD method, a CVD method, and the like may be employed. Of those methods, the sputtering method is desirably employed since the single-oriented crystal film or the signal crystal film can be obtained easily.

As a representative example of the oxide containing the A element and the B element used for the epitaxial deposition method, an $ABO_3$ perovskite oxide having a composition represented by the following formula is desirable.

$$(Pb_{1-x}M_x)_{xm}(Zr_yTi_{1-y})O_z \qquad (1)$$

In the formula (1), M represents one or more atoms selected from the group consisting of La, Ca, Ba, Sr, Bi, Sb, W, and Nb, and x, y, and z which respectively satisfy $0 \leq x < 0.2$, $1.0 \leq xm \leq 1.3$, $0.40 \leq y < 0.65$, and $2.5 \leq z \leq 3.0$ may be used. Of those atoms, the Pb-based oxide is desirably used, and particularly, a lead zirconate titanate is desirably used. By the use of the $ABO_3$ perovskite oxide, the $ABO_3$ perovskite oxide crystal film can be formed.

In order to form the $ABO_3$ perovskite oxide crystal film serving as the piezoelectric/electrostrictive body on the substrate or the lower electrode layer, the substrate is heated up to the temperature at which both the $AO_x$ crystal phase and the $ABO_3$ perovskite oxide crystal that are oxides of atoms represented by A are present. Then, the $AO_x$ crystal phase and the $ABO_3$ perovskite oxide crystal phase are formed on the substrate. The temperature at which both the $AO_x$ crystal phase and the $ABO_3$ perovskite oxide crystal phase are present is, for example, equal to or higher than 450° C. and lower than 600° C., and desirably about 550° C.

After that, the substrate is heated up to the temperature for forming the $ABO_3$ perovskite oxide crystal which exceeds the temperature at which the $AO_x$ crystal can be present. The heating can be called "after-annealing", and the $AO_x$ crystal phase is completely converted into an $ABO_3$ perovskite oxide crystal phase. Assuming that the temperature to which the substrate is heated up at the temperature at which both the $AO_x$ crystal phase and the $ABO_3$ perovskite oxide crystal phase are present is represented as P° C., an after-annealing temperature A° C. is desirably in a range represented by $P+50 \leq A$. Specifically, in a case where the piezoelectric body layer is made of a Pb-based $ABO_3$ perovskite oxide crystal, the temperature A is desirably 600° C. or higher. By the two heating processes, in the $ABO_3$ perovskite oxide film, it is possible to obtain the epitaxial oxide film having the single crystal structure or the single-oriented crystal structure, high crystallinity or high crystal orientation, and having a porous region.

Figure 13:
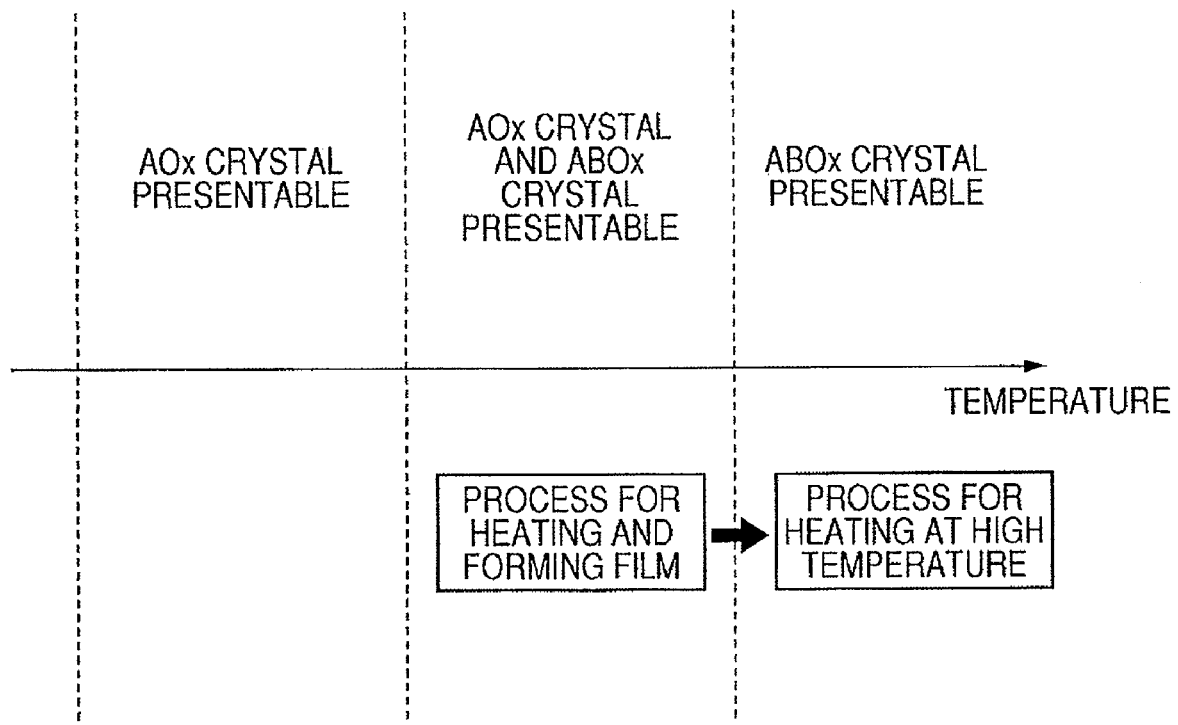
FIG. 13 is a schematic diagram illustrating a manufacturing method for the piezoelectric/electrostrictive body according to the present invention.

FIG. 13 is a schematic diagram illustrating a manufacturing method for a piezoelectric/electrostrictive body according to the present invention. In FIG. 13, a "process for heating and forming a film" is a process for heating the substrate up to the temperature at which the $AO_x$ crystal and the $ABO_3$ perovskite oxide crystal are formed to form a film including the $AO_x$ crystal and the $ABO_3$ perovskite oxide crystal using an oxide containing the A element and the B element. Further, in FIG. 13, a "process for heating at high temperature" is a process for heating the substrate up to the temperature or higher which exceeds the temperature at which the $AO_x$ crystal can be present and at which the $ABO_3$ perovskite oxide crystal is formed. As a result, the film including the $AO_x$ crystal is changed into the $ABO_3$ perovskite oxide crystal film.

Figure 7:
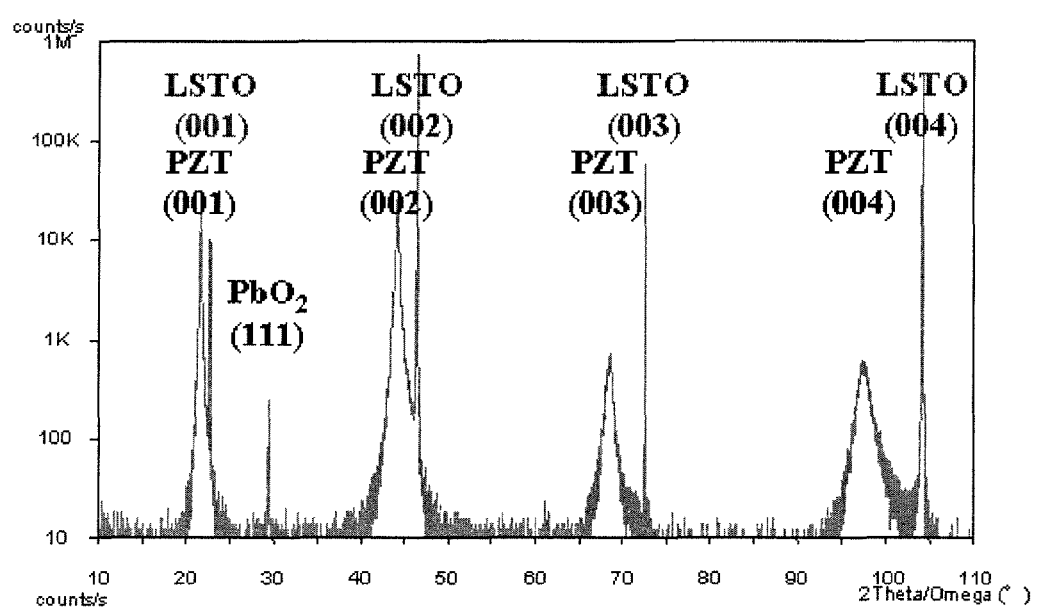
FIG. 7 is a graph illustrating θ-2θ profile obtained by X-ray diffraction of a film formed on a substrate during a process of a manufacturing method for the piezoelectric/electrostrictive body according to the present invention.

FIG. 7 illustrates a deposited film structure on a substrate obtained after an LaSrTiO₃ substrate is heated at a temperature of 550° C. at which both a PbO₂ crystal and a PbZrTiO₃ perovskite oxide crystal are present by the epitaxial deposition method using PbZrTiO₃ as the $ABO_3$ perovskite oxide. In FIG. 7 illustrating the θ-2θ profile of the deposited film obtained by X-ray diffraction, peaks of the LaSrTiO₃ of the substrate, the PbO₂ crystal, and the PbZrTiO₃ perovskite oxide crystal appear, which represents that both the PbO₂ and PbZrTiO₃ are present in the deposited film. At this time, the orientation of the PbO₂ may be, for example, (100) or (110).

Figure 8:
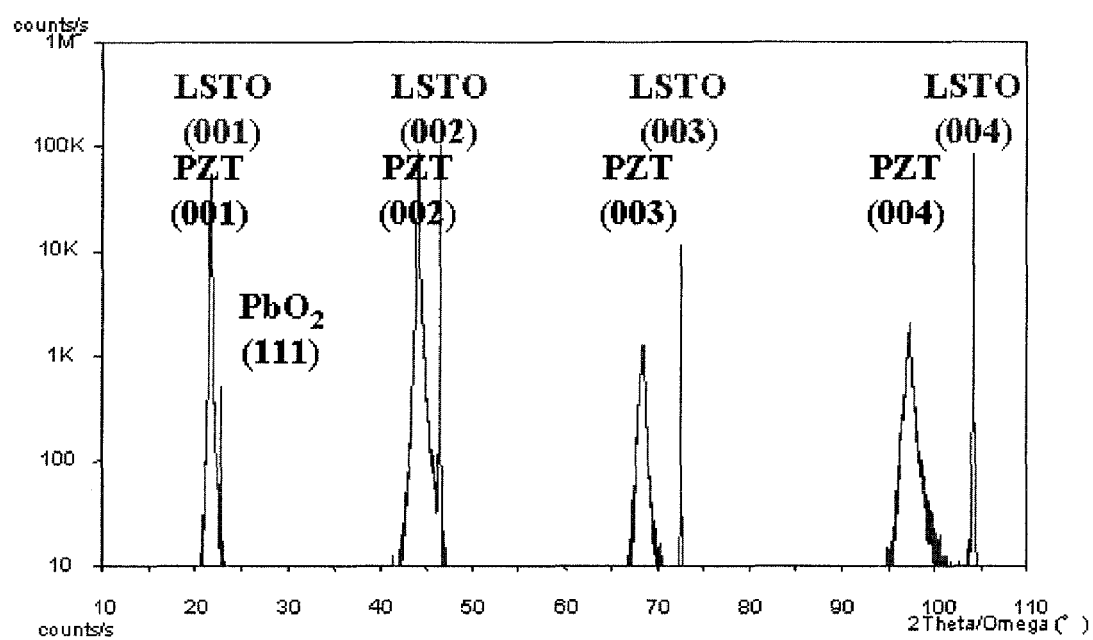
FIG. 8 is a graph illustrating θ-2θ profile obtained by X-ray diffraction of the piezoelectric/electrostrictive body obtained by the manufacturing method for the piezoelectric/electrostrictive body according to the present invention.

FIG. 8 illustrates a deposited film structure on the substrate after heating, which is performed thereafter, at the temperature for forming the $ABO_3$ perovskite oxide crystal which exceeds the temperature at which the $AO_x$ crystal can be present. In FIG. 8 illustrating the θ-2θ profile of the deposited film obtained by X-ray diffraction, a peak of a PbO₂ (111) disappears, and only peaks of the LaSrTiO₃ of the substrate and the PbZrTiO₃ perovskite oxide crystal appear, which represents that only PbZrTiO₃ is present in the deposited film. Further, in the case where the pole of the {110} asymmetric surface is measured with respect to the deposited film, a ring pattern is obtained at a position within the same diameter representing a tilt of about 45 degrees from the center as illustrated in FIG. 4, which represents that the film is an epitaxial film in which PbZrTiO₃ is uniformly formed also within the surface thereof.

The upper electrode layer stacked on the piezoelectric/electrostrictive layer can be formed by the sputtering method or the like in the same manner as in the lower electrode layer, and can be formed also by a gas phase method such as an evaporation method, an application method such as a screen printing method, a liquid phase method such as a plating method, and the like. The upper electrode layer is desirably formed after the after-annealing for heating up the piezoelectric/electrostrictive layer as the lower layer to the temperature for forming the $ABO_3$ perovskite oxide crystal which exceeds the temperature at which the AO, crystal can be present.

Figure 9:
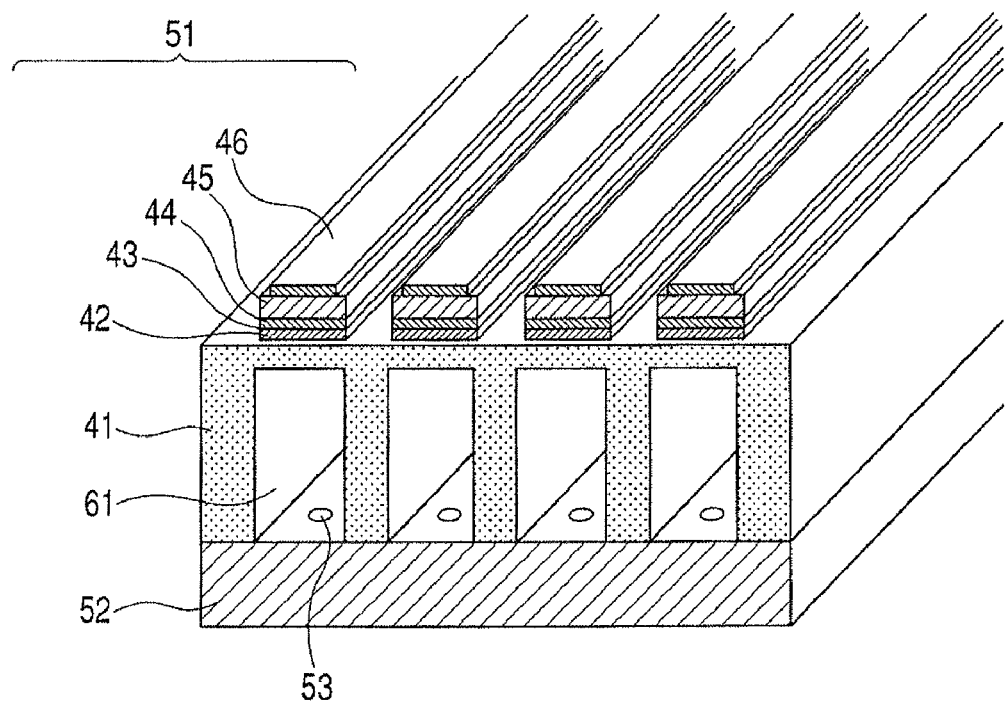
FIG. 9 is a schematic diagram illustrating a structure of an example of a liquid jet head according to the present invention.

The diaphragm, the buffer layer, and the like of the piezoelectric/electrostrictive element can be produced by employing the thin-film deposition technology such as the sputtering method, the CVD method, the PLD method, the Sol-Gel method, the MBE method, and a hydrothermal synthesis method. By producing the diaphragm, the buffer layer, and the like employing those methods, it is possible to obtain those oriented in a specific direction in each layer of the piezoelectric/electrostrictive element. (Liquid Jet Head) A liquid jet head according to the present invention is characterized by including the above-mentioned piezoelectric/electrostrictive element. An example of the liquid jet head of the present invention includes one including the piezoelectric/electrostrictive element 51, a nozzle plate 52 having liquid injection ports 53 as illustrated in FIG. 9. In the substrate 41 of the piezoelectric/electrostrictive element 51, multiple recessed portions 61 are formed in parallel with each other, and the nozzle plate 52 is fixed so as to block the recessed portions to thereby form the multiple individual liquid chambers 61 each having the liquid injection port 53. In the liquid jet head of this example, the liquid injection ports 53 are formed at predetermined intervals on a lower side of each of the recessed portions, but may be formed on a side surface of each of the recessed portions.

The piezoelectric/electrostrictive element 51 is provided so as to correspond to each of the individual liquid chambers 61. Components of FIG. 9 identical with those of FIG. 6 are denoted by the same reference numerals.

In the liquid jet head according to the present invention, the piezoelectric/electrostrictive body has the porous region, so the piezoelectric/electrostrictive body absorbs the strain caused between layers, suppresses degradation of the piezoelectric/electrostrictive property due to the stress, and has excellent durability. Particularly, the piezoelectric/electrostrictive body made of the single-oriented crystal or the single crystal, and more particularly, one made of the $ABO_3$ perovskite oxide crystal can suppress the deterioration of the piezoelectric/electrostrictive property and has a high piezoelectric/electrostrictive property, whereby the liquid injection port can be provided with high density and increased in size. As a result, the liquid jet head according to the present invention can be applied to a printer having high performance.

Figure 10:
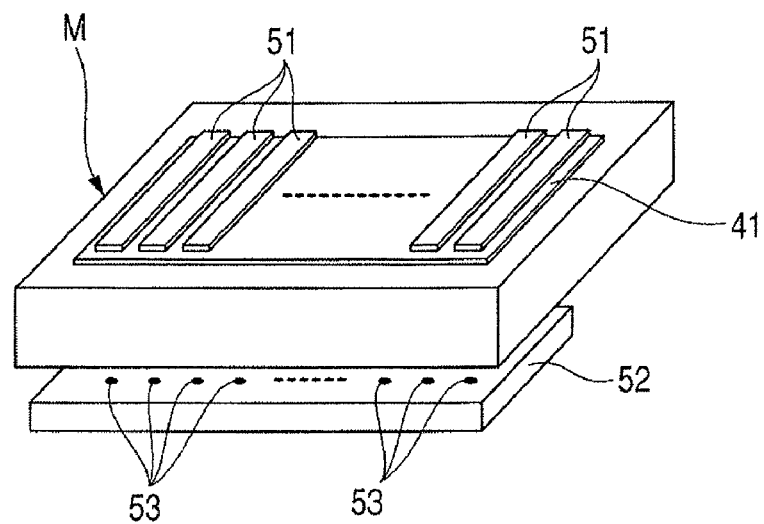
FIG. 10 is a schematic diagram illustrating a structure of another example of a liquid jet head according to the present invention.

The liquid jet head according to the present invention can be manufactured by using the thin-film deposition technology. An example of the method of manufacturing the liquid jet head according to the present invention includes a method of providing the pressure chambers 61 to the substrate 41 of the piezoelectric/electrostrictive element having the above-mentioned structure and providing ink supply paths. As illustrated in FIG. 10, there is another method of providing individual chambers and ink supply paths to a substrate M provided separately from the substrate 41 to which the piezoelectric/electrostrictive element is provided, and joining the substrate M to the substrate 41 to which the piezoelectric/electrostrictive element is provided.

As the former method, on a back surface of the substrate 41 to which the piezoelectric/electrostrictive element is provided, multiple recessed portions serving as the individual liquid chambers 61 are formed at predetermined pitches by dry etching such as wet etching using anisotropic etching, ICP, a Riegger process, and a Bosch process. A shape of the cross-section of the individual chamber in the stacking direction can be appropriately selected from, for example, a rectangular shape, a circular shape, and an oval shape. In a case of a side shooter, the individual liquid chamber may have a narrowed shape with a tapered portion toward the liquid injection port.

The nozzle plate 52 having the liquid injection ports 53 perforated therein is joined to the substrate 41 having recessed portions formed therein. A material of the nozzle plate may be the same as or different from that of the substrate of the piezoelectric element, and is, for example, SUS and Ni. In this case, it is desirably to use a material with a coefficient difference of thermal expansion between the material and the substrate to be joined of 1E-6/° C. to 1E-8/° C. ($1\times10^{-6}$/° C. to $1\times10^{-8}$/° C.).

As a method of joining the substrate 41 and the nozzle plate, a method of using an organic adhesive may be employed, but a method using metal bonding with an inorganic material is desirable. As a material to be used for the metal bonding, it is desirable to use one capable of joining those substrates at a low temperature, that is, 250° C. or lower, and having a small coefficient difference of thermal expansion between the material and the substrate to be joined, from the viewpoint of preventing a problem of warp of the element or the like from occurring even when the element is increased in length, and enabling suppress of a damage to the piezoelectric element. Specific examples of the material used for the metal bonding include In, Au, Cu, Ni, Pb, Ti, and Cr.

As the latter method, the substrate 41 to which the piezoelectric element 51 is formed is joined to the substrate M after positioning the piezoelectric element so as to block opening portions (not shown) formed on a surface side of the substrate M in which the individual liquid chambers (not shown) are formed by the similar method as described above or the like. On the other hand, the nozzle plate 52 in which the liquid injection ports 53 are formed is positioned to be joined so as to block opening portions (not shown) on a back surface side of the substrate M. As a method of bonding the substrate, the similar method as described above may be employed.

The above-mentioned liquid jet head can be used for an ink jet recording apparatus such as a printer with high resolution and high-speed printing, a facsimile machine, a multifunctional machine, and a copying machine, and a liquid discharge device for industrial use for discharging various types of liquids.

EXAMPLE

Example 1

The piezoelectric/electrostrictive element, the manufacturing method for the piezoelectric/electrostrictive body, and the liquid jet head according to the present invention will be described in detail with examples, but the technical scope of the present invention is not limited thereto.

First, by the use of a sputtering device, stabilized zirconia YSZ ($Y_2O_3$—$ZrO_2$) was formed on an opening portion of an Si substrate to thereby produce a diaphragm. At this time, the Si substrate was heated up to 800° C., Ar and $O_2$ were used as ionized gases, sputtering was performed for one hour by setting applied power between the Si substrate and a target to 60 W and setting a pressure inside the device to 1.0 Pa to grow crystals, thereby obtaining a diaphragm having a single orientation and a film thickness of 200 nm.

Next, a lower electrode layer was produced in the same manner as in the method of producing the diaphragm. By the use of Pt as a target, sputtering was performed at a substrate temperature of 600° C., by the use of Ar as an ionized gas, with applied power between the diaphragm and the target of 100 W, and at a pressure inside the device of 0.5 Pa to grow crystals, thereby obtaining a Pt film having a single high orientation and a thickness of 400 nm.

After that, by the use of the sputtering device and a target having the below-mentioned composition, a piezoelectric body was produced by sputtering. Sputtering was performed at a substrate temperature of 550° C., by the use of Ar and $O_2$ as ionized gases, with applied power between an electrode and the target of 100 W, and at a pressure inside the device of 0.5 Pa to grow crystals, thereby obtaining a piezoelectric body having a thickness of 3000 nm. The composition of the target is represented as $PbZr_yTi_{1-y}O_z$, where y=0.52 and z=3.0. Then, rapid thermal annealing (RTA) was employed to perform a heating process for five hours in an atmosphere of 680° C. A cross-section SEM image of the obtained piezoelectric body is illustrated in FIG. 2.

After that, an upper electrode layer was produced in the same manner as in the method of producing the lower electrode layer.

Then, the Si substrate was subjected to a dry etching process by ICP from a surface opposite to a surface on which the diaphragm is provided to remove a central portion thereof, thereby forming a recessed portion. The temperature of the substrate was set to 20° C., SF6 and C4F8 were used as gases, the dielectric of a high-frequency coil was set to 1800 W of RF power, and the pressure inside the device was set to 4.0 Pa. The nozzle plate made of Si having liquid injection ports was bonded to the Si substrate having the above-mentioned recessed portions by Si—Si bonding. Assuming that the diaphragm of each piezoelectric element 10 has a length of 5000 μm and a width of 100 μm, the liquid jet head was produced.

With respect to the obtained liquid jet head, a displacement amount of the piezoelectric element at an applied voltage of 20 V and at 10 kHz, an injection amount of the liquid and an injection speed were measured with an ink (with a density of $1.0 \times 10^3$ kg/m$^3$, a viscosity of 2 cps, and a surface tension of $3.5 \times 10^{-2}$ N/m) being filled in the liquid jet head. The measurement of the displacement amount was performed such that convergence of the liquid jet head in a state where no ink is provided therein was measured with a laser Doppler displacement meter at the center of the recessed portion (at the center of a width of 70 μm and at the center of a length of 3 mm). The measurement of the discharge amount was performed by synchronizing an ejected liquid droplet with an input signal and observing the liquid droplet and its size by CCD. The measurement of the discharge speed was also performed by synchronizing an ejected liquid droplet with an input signal and observing the liquid droplet by CCD. The results are shown in Tables 1 and 2.

Further, a test for durability of the liquid jet head was performed. There was no non-discharging nozzle even when liquid discharge was performed over $10^9$ times.

Comparative Example 1

In producing a piezoelectric body, the piezoelectric body was produced so as to produce a liquid jet head in the same manner as in Example 1 except that crystals were grown at the substrate temperature of 600° C. at the time of sputtering and the piezoelectric body was produced without performing the heating process in the atmosphere.

Figure 11:
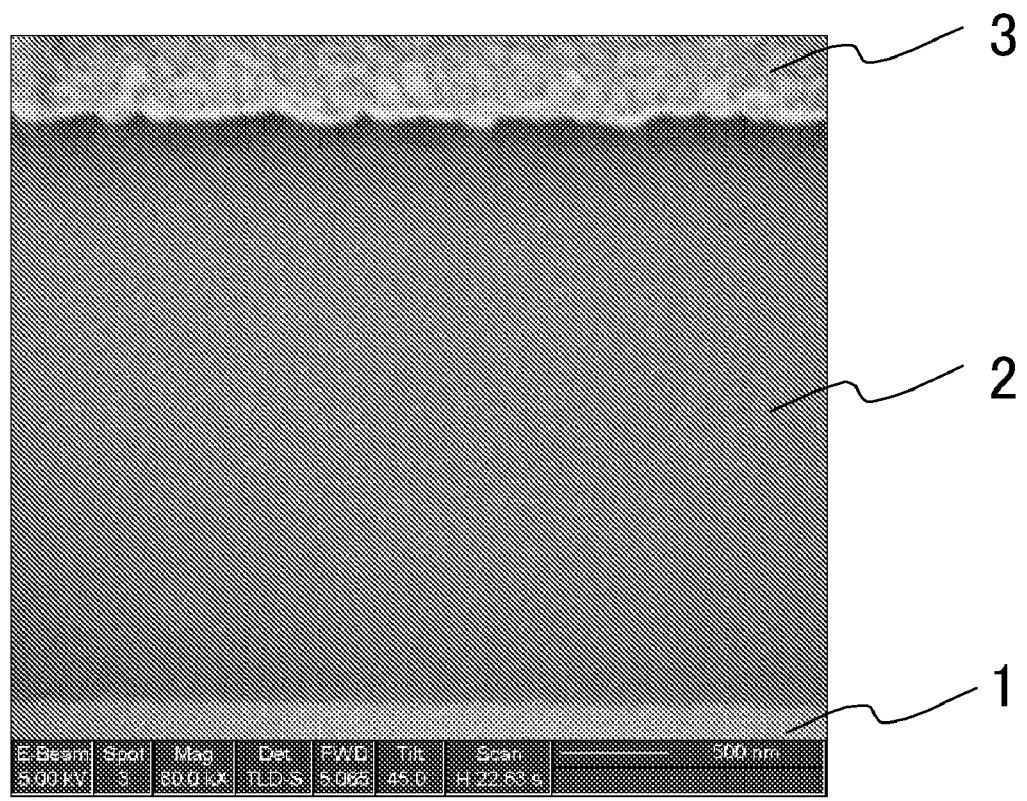
FIG. 11 is a diagram illustrating a cross-section SEM image of a piezoelectric/electrostrictive element according to Comparative Example 1 of the present invention.

A cross-section SEM image of the obtained piezoelectric body was obtained in the same manner as in Example 1. The result is illustrated in FIG. 11. With respect to the liquid jet head, a displacement amount of the piezoelectric element, a discharge amount of liquid droplets of the liquid jet head, and a discharge time were measured in the same manner as in Example 1. The results are shown in Tables 1 and 2.

In addition, in the durability test, after the liquid discharge was performed $10^6$ to $10^7$ times, peeling was caused and a non-discharging nozzle was generated. When the piezoelectric body corresponding to the non-discharging nozzle was analyzed, peeling was caused at an interface between the lower electrode layer and the piezoelectric layer.

Comparative Example 2

In manufacturing a piezoelectric body, a CSD method was employed. Lead acetate having a composition corresponding to the composition similar to that of the target used in Example 1, lanthanum isopropoxide, zirconium butoxide, and titanium isopropoxide were heated and dissolved in methoxyethanol. The solution thus obtained was hydrolyzed with diluted hydrochloric acid, thereby obtaining a coating liquid (sol) for the piezoelectric body having 10 wt. % of Pb1.1La0.01Zr0.52Ti0.48O$_3$ (concentration in terms of oxide).

Then, the sol was coated on the substrate at 3000 rpm by using a spin coater, and was dried for 5 minutes at 400° C. to remove a solvent, thereby forming a precursor film. Every time the operation of coating and drying was repeated three times, temporal burning was performed for 15 minutes at 650° C. After coating, drying, and temporarily burning seven layers, the entire substrate was last subjected to a heating process for 1 hour at 700° C. to be crystallized, thereby obtaining a 7-times coated film of various piezoelectric bodies. The liquid jet head was produced in the same manner as in Example 1 except for the method of producing the piezoelectric body.

Figure 12:
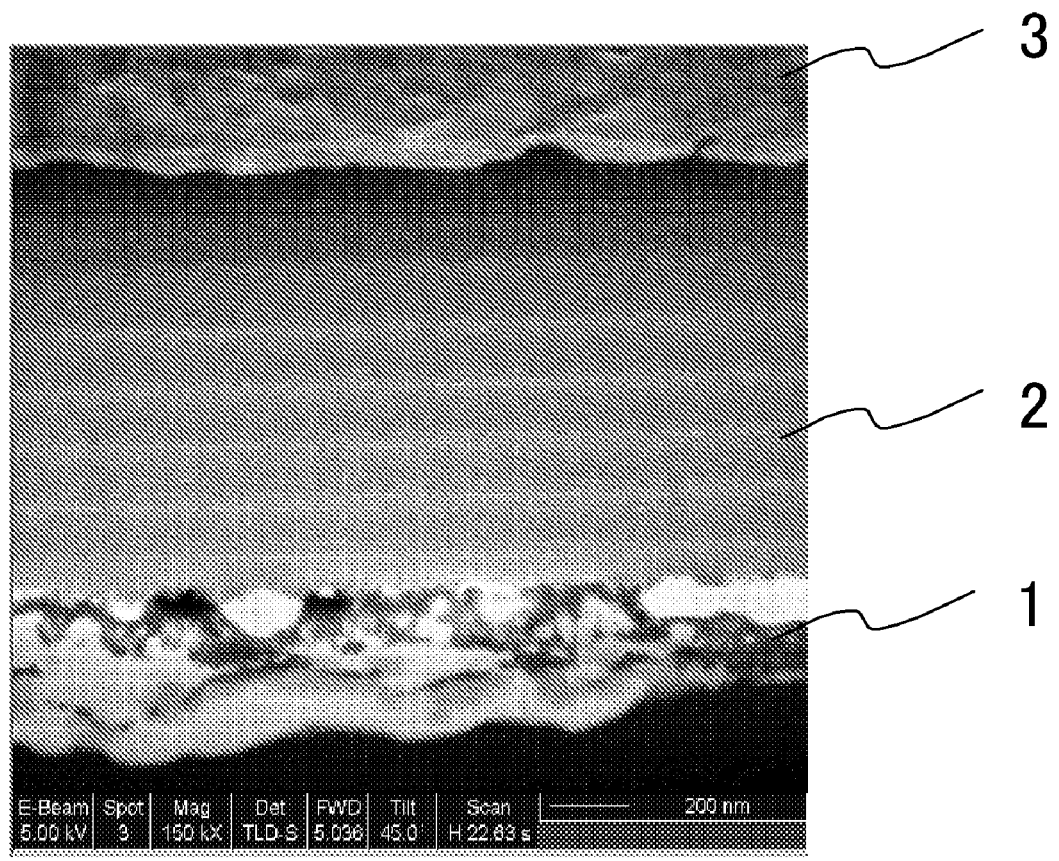
FIG. 12 is a diagram illustrating a cross-section SEM image of a piezoelectric/electrostrictive element according to Comparative Example 2 of the present invention.

A cross-section SEM image of the obtained piezoelectric body was obtained in the same manner as in Example 1. The result is illustrated in FIG. 12. With respect to the liquid jet head, a displacement amount of the piezoelectric element, a discharge amount of liquid droplets of the liquid jet head, and a discharge time were measured in the same manner as in Example 1. The results are shown in Tables 1 and 2.

Further, in the durability test, after the liquid discharge was performed $10^6$ to $10^7$ times, peeling was caused and a non-discharging nozzle was generated. When the piezoelectric body corresponding to the non-discharging nozzle was analyzed, peeling was caused at an interface between the lower electrode layer and the piezoelectric layer.

TABLE 1

|  | Example 1 | Comparative Example 1 | Comparative Example 2 |
| --- | --- | --- | --- |
| Displacement Amount (nm) | 120 | 100 | 90 |

From the results, the displacement amount of the piezoelectric element according to Example 1 was 90 nm. To the contrary, the displacement amount of the piezoelectric element of Comparative Example 1 which includes the piezoelectric body formed by sputtering on a substrate having a temperature of 600° was 100 nm. In addition, the displacement amount of the piezoelectric element of Comparative Example 2 which includes the piezoelectric body produced by the CSD method was 90 nm.

TABLE 2

|  | Example 1 | Comparative Example 1 | Comparative Example 2 |
| --- | --- | --- | --- |
| Discharge Amount (pl) | 14 | 12 | 12 |
| Discharge speed (m/sec) | 8 | 6 | 5 |

As a result, it is apparent that, in the liquid jet head according to the present invention, the liquid discharge amount is increased and the liquid discharge can be performed at a high speed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-194702, filed Jul. 14, 2006, which is hereby incorporated by reference herein in its entirety.

What is claimed is:

1. A method of manufacturing a piezoelectric body formed of a film comprised of an $ABO_3$ perovskite oxide crystal epitaxially grown on a substrate, comprising:

forming a film containing an $AO_x$ crystal and the $ABO_3$ perovskite oxide crystal by using an oxide containing an A element and a B element on the substrate heated to a temperature at which the $AO_x$ crystal and the $ABO_3$ perovskite oxide crystal are formed; and successively changing the film containing the $AO_x$ crystal and the $ABO_3$ perovskite oxide crystal into the film comprised of the $ABO_3$ perovskite oxide crystal by heating in an atmosphere containing oxygen the substrate to a temperature which exceeds a temperature at which the $AO_x$ crystal can be present, and which is at least a temperature at which the $ABO_3$ perovskite oxide crystal is formed.

2. A method of manufacturing a piezoelectric body according to claim 1, wherein the $AO_x$ crystal and the $ABO_3$ perovskite oxide crystal are formed at a temperature of 400° C. to 600° C.

3. A method of manufacturing a piezoelectric body according to claim 1, wherein the $ABO_3$ perovskite oxide comprises a Pb-based oxide.

4. A method of manufacturing a piezoelectric body according to claim 1, wherein the forming is performed by a sputtering method.

* * * * *